(12) United States Patent
Choi et al.

(10) Patent No.: US 7,616,496 B2
(45) Date of Patent: Nov. 10, 2009

(54) CHARGE TRAP TYPE NON-VOLATILE MEMORY DEVICE AND PROGRAM METHOD THEREOF

(75) Inventors: Eun Seok Choi, Seongnam-si (KR); Se Jun Kim, Changwon-si (KR); Kyoung Hwan Park, Seoul (KR); Hyun Seung Yoo, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 68 days.

(21) Appl. No.: 11/771,632

(22) Filed: Jun. 29, 2007

(65) Prior Publication Data

US 2008/0225595 A1  Sep. 18, 2008

(30) Foreign Application Priority Data

Mar. 14, 2007  (KR) ...................... 10-2007-0025097

(51) Int. Cl.
*G11C 16/04* (2006.01)
(52) U.S. Cl. ............................ 365/185.19; 365/185.22; 365/189.09; 365/199
(58) Field of Classification Search ............ 365/185.19, 365/185.22, 189.09, 199
See application file for complete search history.

(56) References Cited

U.S. PATENT DOCUMENTS

| 6,721,204 | B1 | 4/2004 | Yeh et al. | |
|---|---|---|---|---|
| 2005/0237816 | A1* | 10/2005 | Lue et al. | ................ 365/185.28 |
| 2007/0036001 | A1* | 2/2007 | Kanda et al. | ............ 365/185.18 |
| 2007/0183208 | A1* | 8/2007 | Tanaka et al. | ........... 365/185.22 |

FOREIGN PATENT DOCUMENTS

| KR | 1020050112651 A | 12/2005 |
|---|---|---|
| KR | 1020050116975 A | 12/2005 |

* cited by examiner

*Primary Examiner*—Thong Q Le
(74) *Attorney, Agent, or Firm*—Townsend and Townsend and Crew LLP

(57) ABSTRACT

A method of programming a charge trap type non-volatile memory device includes applying a program pulse to a selected memory cell, applying a detrap pulse to the selected memory cell, and applying a program verify pulse to the memory cell. The charge trap type non-volatile memory device includes a memory cell array including a charge trap memory cell, and a high voltage generator for supplying a detrap pulse to the charge trap memory cell.

14 Claims, 3 Drawing Sheets

CHARGE TRAP TYPE NON-VOLATILE MEMORY DEVICE AND PROGRAM METHOD THEREOF

CROSS-REFERENCES TO RELATED APPLICATIONS

The present application claims priority to Korean patent application number 2007-25097, filed on Mar. 14, 2007, which is incorporated by reference in its entirety.

BACKGROUND OF THE INVENTION

The present invention relates to a charge trap type non-volatile memory device and a program method thereof.

Non-volatile memory devices for storing data can be classified into a floating gate type non-volatile memory device and a charge trap type non-volatile memory device, depending on the type of storage layer that comprises a unit cell of a memory cell. The floating gate type non-volatile memory device is adapted to store charges in a floating gate, whereas the charge trap type non-volatile memory device is adapted to accumulate charges on a trap existing in a dielectric layer, such as a silicon nitride layer. The floating gate type non-volatile memory device requires a high voltage for program and erase operations when the cell size is reduced. In contrast, the charge trap type non-volatile memory device complies with low power and low voltage requirements and can realize high integration.

In the charge trap type non-volatile memory device, charges of several energy levels are trapped at a specific memory cell due to the distribution characteristic of trap energy. In particular, shallow trapped charges of energy distributions of trapped charges easily disappear even at a low electric field such as a read voltage, thereby degrading read endurance.

SUMMARY OF THE INVENTION

Accordingly, the present invention addresses the above problems, and discloses a program method of a charge trap type non-volatile memory device, in which voltage is applied to remove shallow-trapped charges while a program pulse is applied. Furthermore, the present invention discloses a charge trap type non-volatile memory device in which a detrap pulse is applied.

In an aspect of the present invention, a method of programming a charge trap type non-volatile memory device includes applying a program pulse to a selected memory cell, applying a detrap pulse to remove shallow-trapped charges from the cell to which the program pulse has been applied, and applying a program verify pulse to the memory cell.

In another aspect of the present invention, a charge trap type non-volatile memory device includes a memory cell array having a charge trap memory cell, and a high voltage generator for supplying a detrap pulse to the charge trap memory cell.

DESCRIPTION OF SPECIFIC EMBODIMENTS

A specific embodiment according to the present invention will be described with reference to the accompanying drawings.

Figure 1:
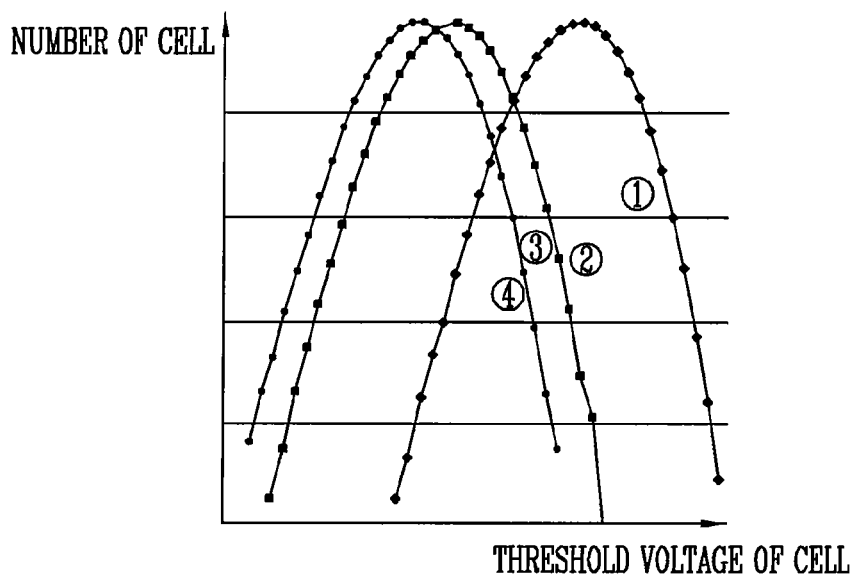
FIG. 1 is a graph illustrating distributions of threshold voltage of a cell during a read operation of a typical charge trap type non-volatile memory device.

FIG. 1 is a graph illustrating distributions of threshold voltage of a cell during a read operation of a typical charge trap type non-volatile memory device.

Charges which are shallow-trapped at the dielectric layer, are detrapped (i.e., released) by a low level read voltage applied during a read operation. FIG. 1 illustrates distributions (1) of a threshold voltage at a specific cell upon program verification. The threshold voltage is gradually lowered (2, 3, and 4) due to a degradation of read endurance.

In order to address this problem, a detrap pulse is applied to remove the shallow-trapped charges before a verify voltage is applied but after application of a program pulse.

Figure 2:
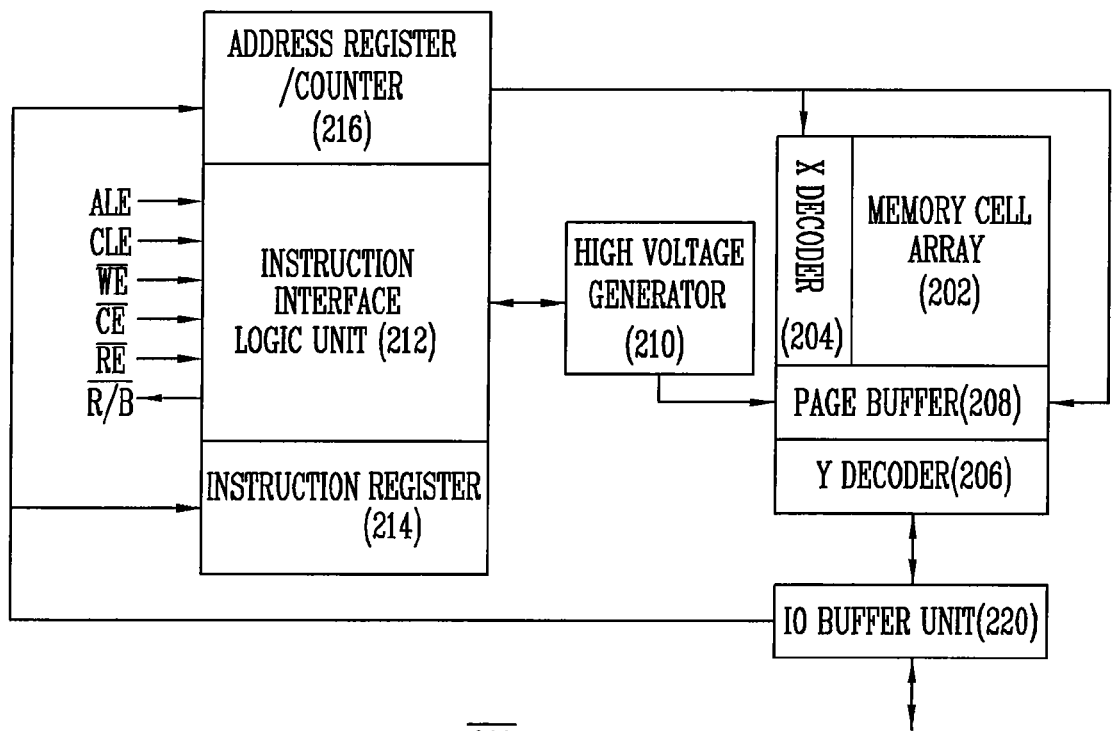
FIG. 2 is a functional block diagram of a charge trap type non-volatile memory device to which the present invention is applied.

FIG. 2 is a functional block diagram of a charge trap type non-volatile memory device to which the present invention is applied.

A charge trap type non-volatile memory device 200 includes a memory cell array 202 having a memory cell for storing data according to a charge trap method, a page buffer 208, X/Y decoders 204 and 206, a high voltage generator 210, an instruction interface logic unit 212, an instruction register 214, an address register/counter 216, and an 10 buffer unit 220. The operation of the non-volatile memory device is described below.

If a chip enable signal /CE is disabled and a write enable signal /WE is toggled with respect to the instruction interface logic unit 212, the instruction interface logic unit 212 receives a command signal through the IO buffer unit 220 and the instruction register 214 in response thereto. The instruction interface logic unit 212 generates a program command, an erase command or a read command in response to the command signal. The command signal includes a page program setup code for determining the operating mode of the non-volatile memory device. Meanwhile, a ready/busy-bar signal /R/B output from the instruction interface logic unit 212 is disabled for a predetermined period of time. An external memory controller (not illustrated) receives the ready/busy-bar signal /R/B and recognizes that the non-volatile memory device is in an operating state such as program/erase/read. In other words, while the ready-bar and busy-bar signals /R and /B are disabled, a program/erase/read operation is performed on one of the pages of the memory cell array.

Furthermore, the address register/counter 216 receives the address signal from the IO buffer unit 220, and generates a row address signal and a column address signal. The address signal corresponds to one of the pages included in one of the memory cells.

The high voltage generator 210 generates bias voltages in response to the program command, the erase command or the read command, and supplies the bias voltages to the page buffer 208, the X-decoder 204, etc. The X-decoder 204 supplies the memory cell array 202 of one of the blocks of the memory cell array with the bias voltages, received from the high voltage generator 210, in response to the row address signal.

The Y-decoder 206 supplies a data signal to bit lines (not illustrated) shared by blocks of the memory cell array through the page buffer 208 in response to the column address signal. The page buffer 208 latches the data signal received through the IO buffer unit 220 and the Y-decoder 206, and outputs the data signal to the bit lines (not illustrated) shared by the blocks of the memory cell array.

In the charge trap type non-volatile memory device of the present invention, a program pulse and a program verify pulse are applied through the high voltage generator 210, the X-decoder 204, etc., and various forms of detrap pulses are applied. The various forms of the detrap pulses according to an embodiment of the present invention will be described below.

Figure 3:
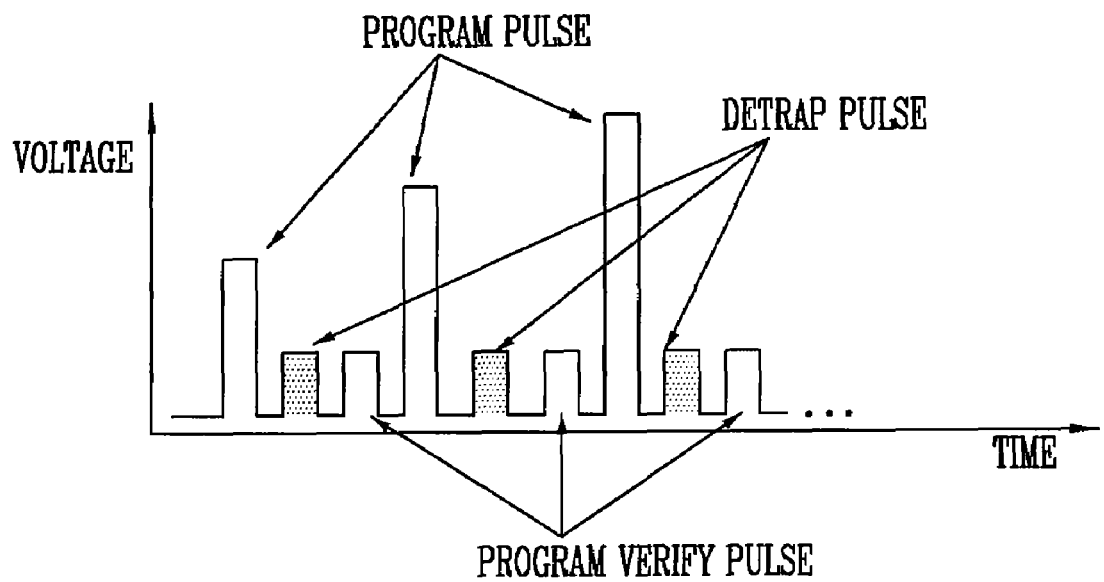
FIG. 3 is a view illustrating voltage signals applied during a program operation of the charge trap type non-volatile memory device according to an embodiment of the present invention.

FIG. 3 is a view illustrating voltage signals applied during a program operation of the charge trap type non-volatile memory device according to an embodiment of the present invention.

The program pulse is applied to a specific cell according to an Incremental Step Pulse Program (ISPP) method, but the detrap pulse is additionally applied between the program pulse and the program verify pulse. In other words, a specific cell is programmed according to a specific program pulse, but during the program operation, shallow-trapped charges may exist. Thus, after the shallow-trapped charges are removed, a program verification operation is performed on the basis of the removed state.

The pulse voltage that is applied to remove the shallow-trapped charges as described above is referred to as a detrap pulse. The detrap pulse may have a voltage level which is higher than that of the verify voltage applied to selected word lines upon program verification. Alternatively, the detrap pulse may have an opposite direction of magnitude relative to the verify voltage, depending on the characteristic of dielectric material.

Though it will be described later with reference to the drawings, the detrap pulse can be modified in various forms depending on the voltage level of a pulse and the control of a pulse width.

The embodiment illustrated in FIG. 3 shows a detrap pulse having substantially the same voltage level as the program verify pulse. The detrap pulse can have a voltage level which is lower than that of the program pulse, but which is substantially the same as that of the program verify pulse. In this case, a pulse width of the detrap pulse is substantially the same as that of the program verify pulse.

Figure 4:
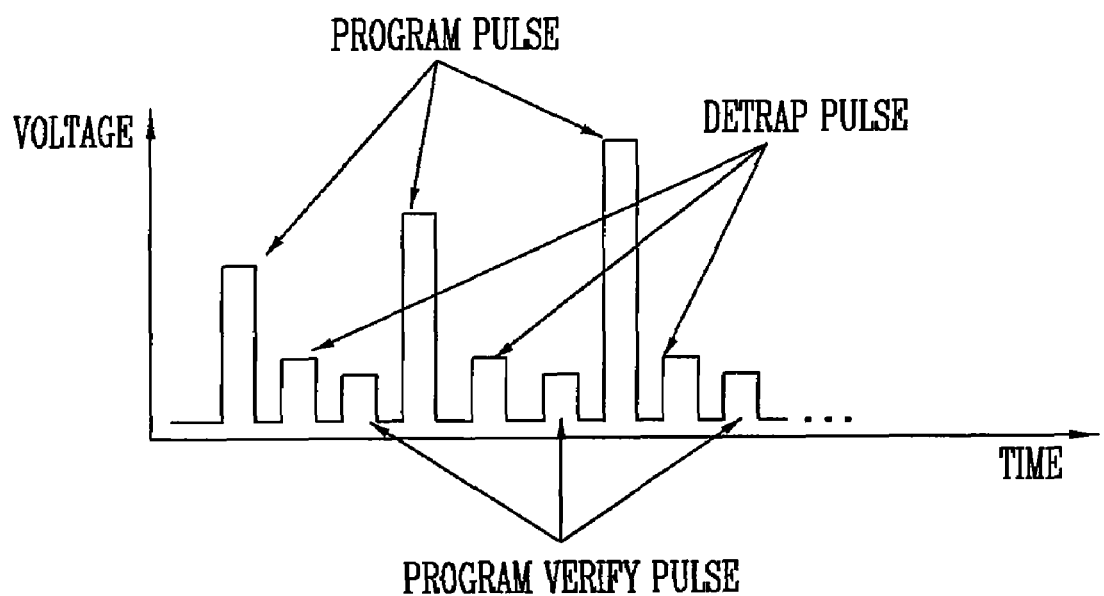
FIG. 4 is a view illustrating voltage signals applied during a program operation of the charge trap type non-volatile memory device according to another embodiment of the present invention.

FIG. 4 is a view illustrating voltage signals applied during a program operation of the charge trap type non-volatile memory device according to another embodiment of the present invention.

As illustrated in FIG. 4, a detrap pulse has a voltage level that is higher than that of a program verify pulse.

The detrap pulse can have a voltage level, which is lower than that of the program pulse, but which is higher than that of the program verify pulse. In this case, a pulse width of the detrap pulse is substantially the same as that of the program verify pulse.

The amount of time it takes for shallow-trapped charges to be detrapped can be shortened by controlling the voltage level of the detrap pulse, as described above.

Figure 5:
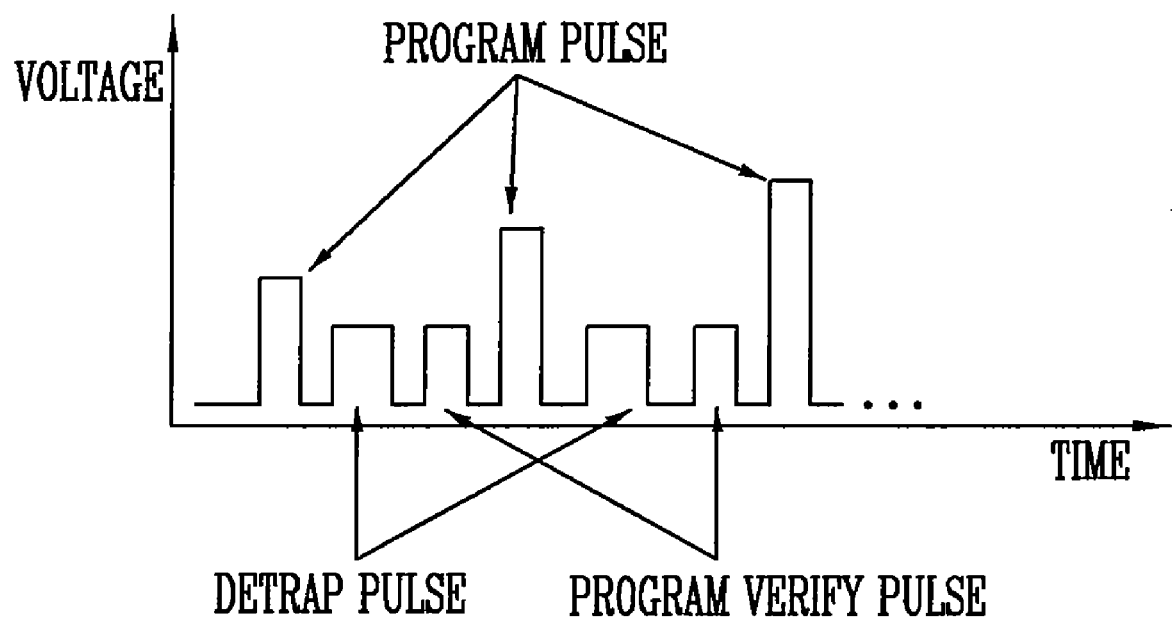
FIG. 5 is a view illustrating voltage signals applied during a program operation of the charge trap type non-volatile memory device according to still another embodiment of the present invention.

FIG. 5 is a view illustrating voltage signals applied during a program operation of the charge trap type non-volatile memory device according to still another embodiment of the present invention. As illustrated in FIG. 5, the detrap pulse has a pulse width which is wider than that of the program verify pulse. In this case, the detrap pulse can have a voltage level, which is lower than that of the program pulse, but which is substantially the same as that of the program verify pulse.

Furthermore, a detrap pulse which additionally includes the characteristics of the embodiment of FIG. 4 can be applied. In other words, the detrap pulse may have a voltage level, which is lower than that of the program pulse, but which is higher than that of the program verify pulse, and the detrap pulse may have a pulse width which is wider than that of the program verify pulse.

The amount of time required for shallow-trapped charges to be detrapped can be shortened by controlling the pulse width of the detrap pulse, as described above.

According to another embodiment of the present invention, the detrap pulse can have substantially the same voltage level as that of a pass voltage (Vpass) applied to unselected word lines during the program operation.

The detrap pulse can have a voltage level, which is lower than that of the program pulse, but which is substantially the same as that of the pass voltage.

According to still another embodiment of the present invention, the detrap pulse can have a voltage level which is higher than that of the pass voltage applied to unselected word lines during a program operation.

The detrap pulse can have a voltage level, which is lower than that of the program pulse, but which is higher than that of the pass voltage.

The amount of time required for shallow-trapped charges to be detrapped can be shortened by controlling the voltage level of the detrap pulse, as described above.

According to another embodiment of the present invention, the detrap pulse can have a pulse width which is wider than that of the pass voltage applied to unselected word lines during a program operation. In this case, the detrap pulse can have a voltage level, which is lower than that of the program pulse, but which is substantially the same as that of the pass voltage.

Furthermore, the detrap pulse can have a voltage level, which is lower than that of the program pulse, but which is higher than that of the pass voltage, and the detrap pulse can also have a pulse width which is wider than that of the pass voltage.

The detrap pulse can have a voltage level, which is lower than that of the program pulse, but which is higher than that of the pass voltage.

The amount of time required for shallow-trapped charges to be detrapped can be shortened by controlling the pulse width of the detrap pulse, as described above.

In accordance with the charge-trap type non-volatile memory device described above according to the present invention, the step of removing shallow-trapped charges is performed before the program verification operation. Accordingly, a variation in threshold voltage distributions can be prevented, and read endurance can be secured.

Although the foregoing description has been made with reference to specific embodiments, it is to be understood that changes and modifications to the present invention may be made by one having ordinary skill in the art without departing from the spirit and scope of the present invention and the appended claims.

What is claimed is:

1. A method of programming a charge trap type non-volatile memory device, the method comprising:

applying a program pulse to a selected memory cell;

applying a detrap pulse to the selected memory cell; and applying a program verify pulse to the selected memory cell, wherein a voltage level of the detrap pulse is lower than that of the program pulse, and is higher than that of the program verify pulse.

2. The program method of claim 1, wherein the detrap pulse is applied to remove shallow-trapped charges from the selected memory cell.

3. The program method of claim 1, wherein applying the program pulse, the detrap pulse and the program verify pulse are continuously repeated until a program operation is completed.

4. The program method of claim 1, wherein a pulse width of the detrap pulse is wider than that of the program verify pulse.

5. The program method of claim 1, wherein a pulse width of the detrap pulse is substantially the same as that of the program verify pulse.

6. The program method of claim 1, wherein a voltage level of the detrap pulse is substantially the same as that of a pass voltage.

7. The program method of claim 1, wherein a voltage level of the detrap pulse is higher than that of a pass voltage.

8. The program method of claim 1, wherein a pulse width of the detrap pulse is wider than that of the program verify pulse, and a voltage level of the detrap pulse is substantially the same as that of a pass voltage.

9. The program method of claim 1, wherein a pulse width of the detrap pulse is wider than that of the program verify pulse, and a voltage level of the detrap pulse is higher than that of a pass voltage.

10. A charge trap type non-volatile memory device comprising:

a memory cell array; and a high voltage generator for supplying a detrap pulse to a memory cell in the memory cell array, wherein a voltage level of the detrap pulse is lower than that of a program pulse, and is higher than that of a program verify pulse.

11. The charge trap type non-volatile memory device of claim 10, wherein the detrap pulse is applied between an application of the program pulse and an application of the program verify pulse.

12. The charge trap type non-volatile memory device of claim 10, wherein a pulse width of the detrap pulse is wider than that of the program verify pulse.

13. The charge trap type non-volatile memory device of claim 10, wherein a voltage level of the detrap pulse is substantially the same as or higher than that of a pass voltage.

14. The charge trap type non-volatile memory device of claim 10, wherein a pulse width of the detrap pulse is wider than that of the program verify pulse, and a voltage level of the detrap pulse is substantially the same as or higher than that of a pass voltage.

* * * * *